United States Patent
Ichikawa (10) Patent No.: US 9,007,505 B2
(45) Date of Patent: Apr. 14, 2015

(54) IMAGE SENSOR WITH TRANSFER TRANSISTORS WHOSE ON PERIODS ARE CONTROLLED BY TIMING SIGNALS BASED ON TRANSISTOR TRANSFER EFFICIENCIES

(75) Inventor: Shigeru Ichikawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 188 days.

(21) Appl. No.: 13/556,724

(22) Filed: Jul. 24, 2012

(65) Prior Publication Data

US 2013/0050551 A1    Feb. 28, 2013

(30) Foreign Application Priority Data

Aug. 29, 2011   (JP) ................................ 2011-186360

(51) Int. Cl.
| | |
|---|---|
| H04N 5/335 | (2011.01) |
| H04N 3/14 | (2006.01) |
| H01L 27/146 | (2006.01) |
| H04N 5/365 | (2011.01) |
| H04N 5/3745 | (2011.01) |

(52) U.S. Cl.
CPC .......... *H01L 27/14641* (2013.01); *H04N 5/365* (2013.01); *H04N 5/37457* (2013.01)

(58) Field of Classification Search
None
See application file for complete search history.

(56) References Cited

U.S. PATENT DOCUMENTS

| | | | | |
|---|---|---|---|---|
| 6,259,478 | B1* | 7/2001 | Hori | 348/296 |
| 2006/0017829 | A1* | 1/2006 | Gallagher | 348/276 |
| 2006/0203112 | A1* | 9/2006 | Aoki | 348/294 |
| 2008/0157994 | A1* | 7/2008 | Morse et al. | 340/825 |
| 2009/0121143 | A1* | 5/2009 | Takenaka et al. | 250/369 |
| 2011/0024774 | A1* | 2/2011 | Tredwell et al. | 257/93 |
| 2011/0260038 | A1* | 10/2011 | Hirotsu et al. | 250/208.1 |

FOREIGN PATENT DOCUMENTS

JP       09-046596       2/1997

* cited by examiner

*Primary Examiner* — Dennis Hogue
(74) *Attorney, Agent, or Firm* — Cowan, Liebowitz & Latman, P.C.

(57) ABSTRACT

An image sensor in which one unit structure includes a plurality of photo-electric conversion units, a floating diffusion, a plurality of transfer transistors which are arranged in correspondence with the plurality of photo-electric conversion units so as to transfer charges respectively converted by the plurality of photo-electric conversion units to the floating diffusion, a source-follower amplifier which outputs a voltage signal according to a charge amount of the floating diffusion, and a reset transistor which resets the plurality of photo-electric conversion units and the floating diffusion, and a plurality of unit structures are two-dimensionally arranged in a row direction and a column direction, the image sensor comprising a control unit which divides the plurality of unit structures into a plurality of groups, and controls the transfer transistors for each divided group.

12 Claims, 8 Drawing Sheets

IMAGE SENSOR WITH TRANSFER TRANSISTORS WHOSE ON PERIODS ARE CONTROLLED BY TIMING SIGNALS BASED ON TRANSISTOR TRANSFER EFFICIENCIES

BACKGROUND OF THE INVENTION

1. Field of the Invention

The present invention relates to an image sensor and an image capturing apparatus.

2. Description of the Related Art

A digital camera, which aims at capturing still images and moving images, normally uses a CCD sensor as an image sensor so far. However, in recent years, performance of a CMOS sensor has been remarkably improved, and substitutions from a CCD sensor have progressed in some cameras. As one of features of a CMOS sensor, each pixel has an active element. As this effect, each pixel can convert charges into a voltage signal, and it is known that smear, which is a problem in a CCD sensor and is generated upon capturing a high-luminance object, can be greatly reduced. However, as a negative effect, a light-receiving area cannot be broadened, and a numerical aperture decreases, thus posing a problem. In order to solve this problem, a method of sharing an active element, which is arranged for each pixel in a conventional CMOS sensor, by a plurality of pixels to broaden a light-receiving area (Japanese Patent Laid-Open No. 9-46596) has been proposed.

However, by increasing the number of pixels which share an active element so as to broaden a light-receiving area, symmetry for each pixel is unwantedly collapsed, thus posing another problem. It is known that this problem results in a drop of optical characteristics such as shading characteristics and spectral characteristics. Furthermore, since a layout difference of, for example, wiring lengths between sharing pixels is generated, charge transfer characteristics undesirably drop.

Conventionally, since the influence on image quality caused by the charge transfer characteristic drop is minimal, it is not seen as a problem. However, as low-noise and high-sensitivity requirements for image sensors used in recent digital cameras become stricter, the influence on image quality caused by poor symmetry can no longer be ignored.

SUMMARY OF THE INVENTION

The present invention has been made in consideration of the aforementioned problems, and suppresses an image quality drop while assuring a large light-receiving area of each pixel in a CMOS type image sensor.

In order to solve the aforementioned problems and to achieve the above object, according to a first aspect of the present invention, there is provided an image sensor in which one unit structure includes a plurality of photo-electric conversion units which convert light into charges, a floating diffusion which temporarily accumulates the charges, a plurality of transfer transistors which are arranged in correspondence with the plurality of photo-electric conversion units so as to transfer charges respectively converted by the plurality of photo-electric conversion units to the floating diffusion, a source-follower amplifier which outputs a voltage signal according to a charge amount of the floating diffusion, and a reset transistor which resets the plurality of photo-electric conversion units and the floating diffusion, and a plurality of unit structures are two-dimensionally arranged in a row direction and a column direction, the image sensor comprising: a control unit which divides the plurality of unit structures into a plurality of groups, and controls the transfer transistors for each divided group.

According to a second aspect of the present invention, there is provided an image capturing apparatus comprising: an image sensor in which one unit structure includes a plurality of photo-electric conversion units which convert light into charges, a floating diffusion which temporarily accumulates the charges, a plurality of transfer transistors which are arranged in correspondence with the plurality of photo-electric conversion units so as to transfer charges respectively converted by the plurality of photo-electric conversion units to the floating diffusion, a source-follower amplifier which outputs a voltage signal according to a charge amount of the floating diffusion, and a reset transistor which resets the plurality of photo-electric conversion units and the floating diffusion, and a plurality of unit structures are two-dimensionally arranged in a row direction and a column direction, and which comprises a control unit which divides the plurality of unit structures into a plurality of groups, and controls the transfer transistors for each divided group; an A/D converter which converts a signal output from the image sensor into a digital signal; a signal processor which applies predetermined image signal processing to the digital signal input from the A/D converter; a timing generator which generates timing signals and outputs the generated timing signals to the image sensor, the A/D converter, and the signal processor; and a control unit which controls the overall apparatus.

Further features of the present invention will become apparent from the following description of exemplary embodiments with reference to the attached drawings.

DESCRIPTION OF THE EMBODIMENTS

Embodiments of the present invention will be described in detail hereinafter with reference to the accompanying drawings.

First Embodiment

Figure 1:
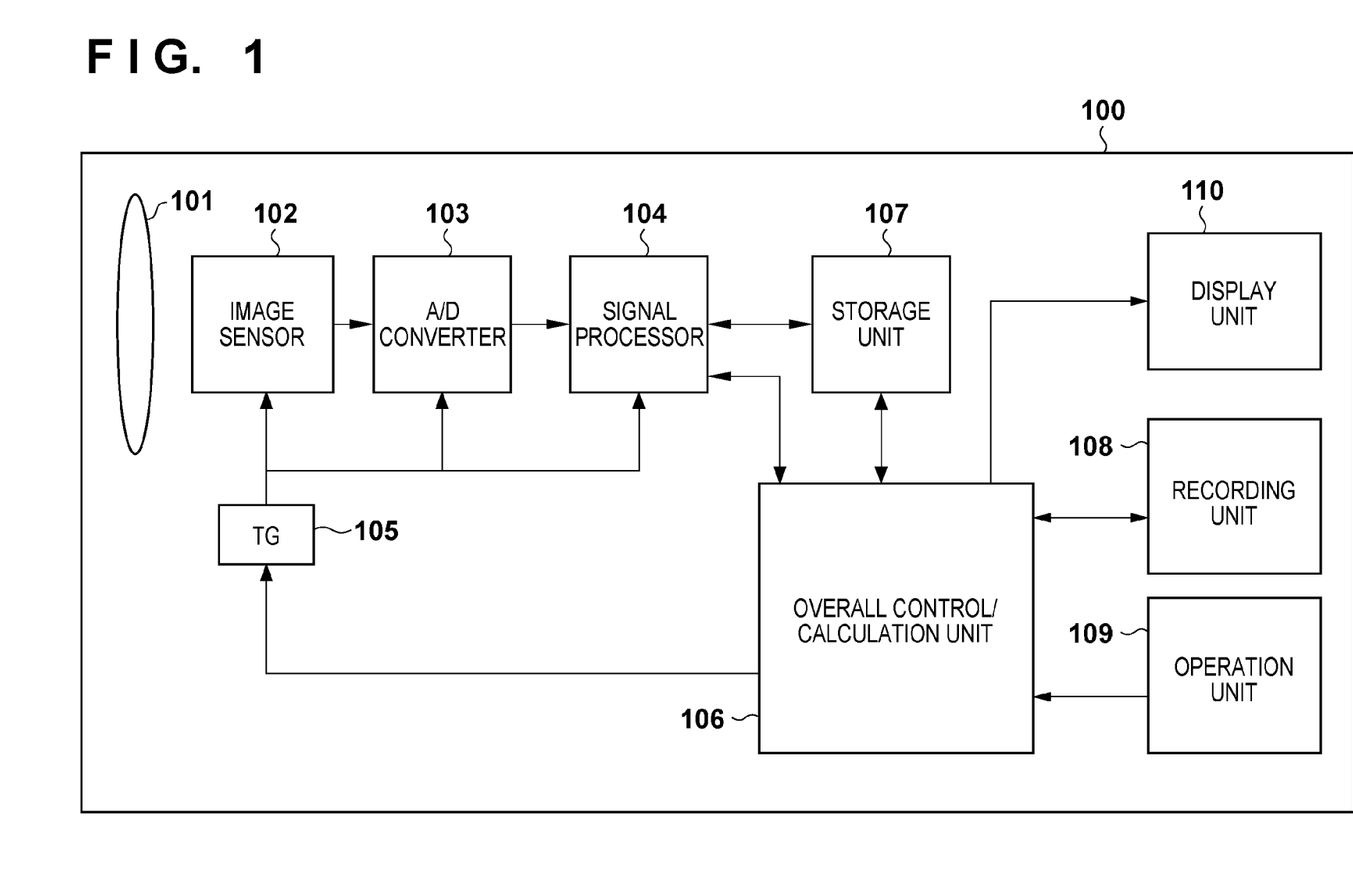
FIG. 1 is a functional block diagram showing the arrangement of an image capturing apparatus according to an embodiment of the present invention.

FIG. 1 is a block diagram showing the arrangement of an image capturing apparatus according to the first embodiment of the present invention.

Referring to FIG. 1, an image capturing apparatus 100 is a digital camera in this embodiment. A lens 101 condenses light coming from an object onto an image sensor 102. The lens 101 includes a zoom lens used to change a focal length, a stop used to change an aperture size with respect to incoming light, a shutter used to intercept incoming light, and the like.

The CMOS type image sensor 102 photo-electrically converts light input via the lens 101 to generate an analog electrical signal. An A/D converter 103 converts an analog signal input from the image sensor 102 into a digital signal. The A/D converter 103 includes an OB clamp circuit which converts an analog signal into a digital value with reference to a predetermined value upon execution of A/D conversion processing.

A signal processor 104 applies predetermined image signal correction processing to each pixel signal input from the A/D converter 103. A timing generator (to be abbreviated as TG hereinafter) 105 generates timing signals required for the image sensor 102, A/D converter 103, and signal processor 104 based on an input signal from an overall control/calculation unit 106.

The overall control/calculation unit 106 executes processes and calculations required for the operation of the image capturing apparatus 100. A storage unit 107 stores captured image data, adjustment data, image data, signal processing data, and the like. A recording unit 108 records image data generated by the overall control/calculation unit 106 based on signals from the signal processor 104.

An operation unit 109 includes a human IF such as buttons and dials, and issues operation instructions of the image capturing apparatus 100. A display unit 110 displays image data generated by the overall control/calculation unit 106 based on signals from the signal processor 104, and displays icons and the like corresponding to operations input from the operation unit 109.

Figure 2:
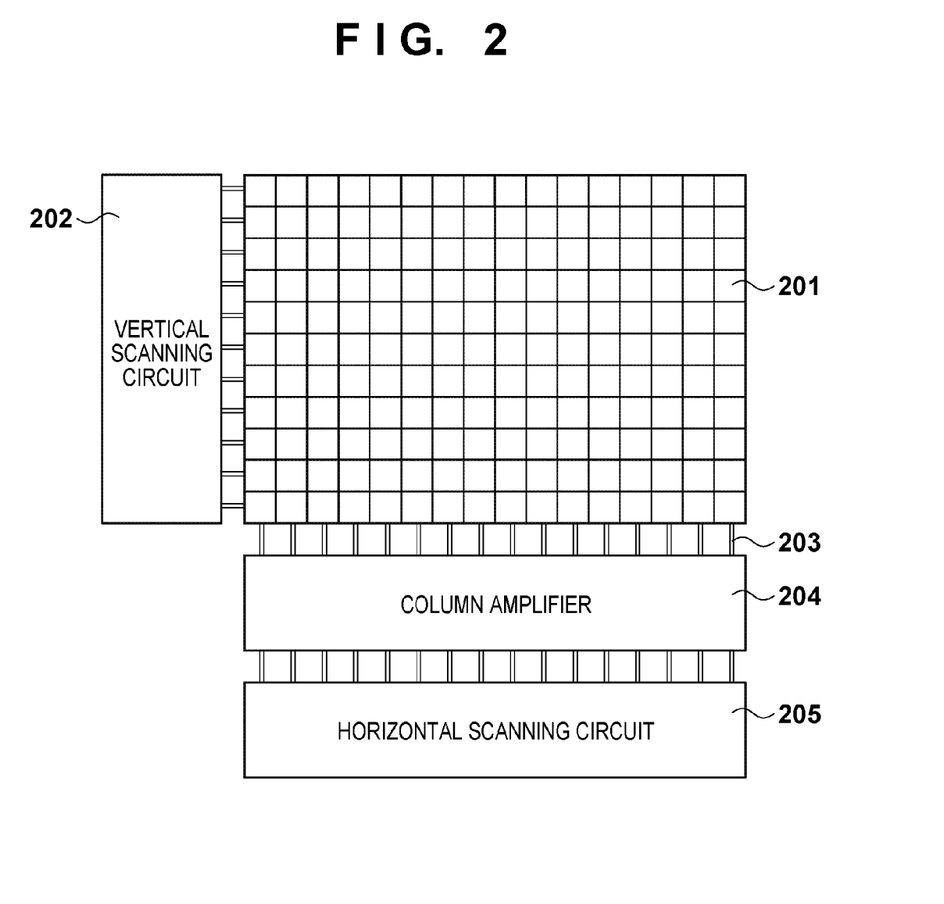
FIG. 2 is a view showing the arrangement of an image sensor according to the embodiment of the present invention.

FIG. 2 is a view showing the arrangement of the image sensor 102 shown in FIG. 1. A pixel unit 201 is a portion (photo-electric conversion unit) which receives light coming from the lens 101, and includes a light-receiving pixel which photo-electrically converts light incident on its surface and outputs it as an electrical signal, and a light-shielding pixel used upon deciding a black reference of an image. A vertical scanning circuit 202 includes a shift register, and selects a read-out row from the image sensor by switching a voltage of a signal line for each row. Vertical output lines 203 are commonly connected to the pixel units 201 arranged in a single column, and are arranged to transmit output signals to a subsequent stage.

A column amplifier 204 receives and amplifies a signal of a pixel selected by the vertical scanning circuit. A horizontal scanning circuit 205 includes a shift register and a circuit for temporarily saving a voltage signal. The horizontal scanning circuit 205 temporarily saves outputs from the column amplifier, selects them in a predetermined order, and externally outputs the selected outputs.

In this embodiment, the A/D converter 103 is arranged after the horizontal scanning circuit. Even in a structure in which the A/D converter 103 is arranged before the horizontal scanning circuit 205, the same effects can be obtained by executing the operation of this embodiment.

Figure 3:
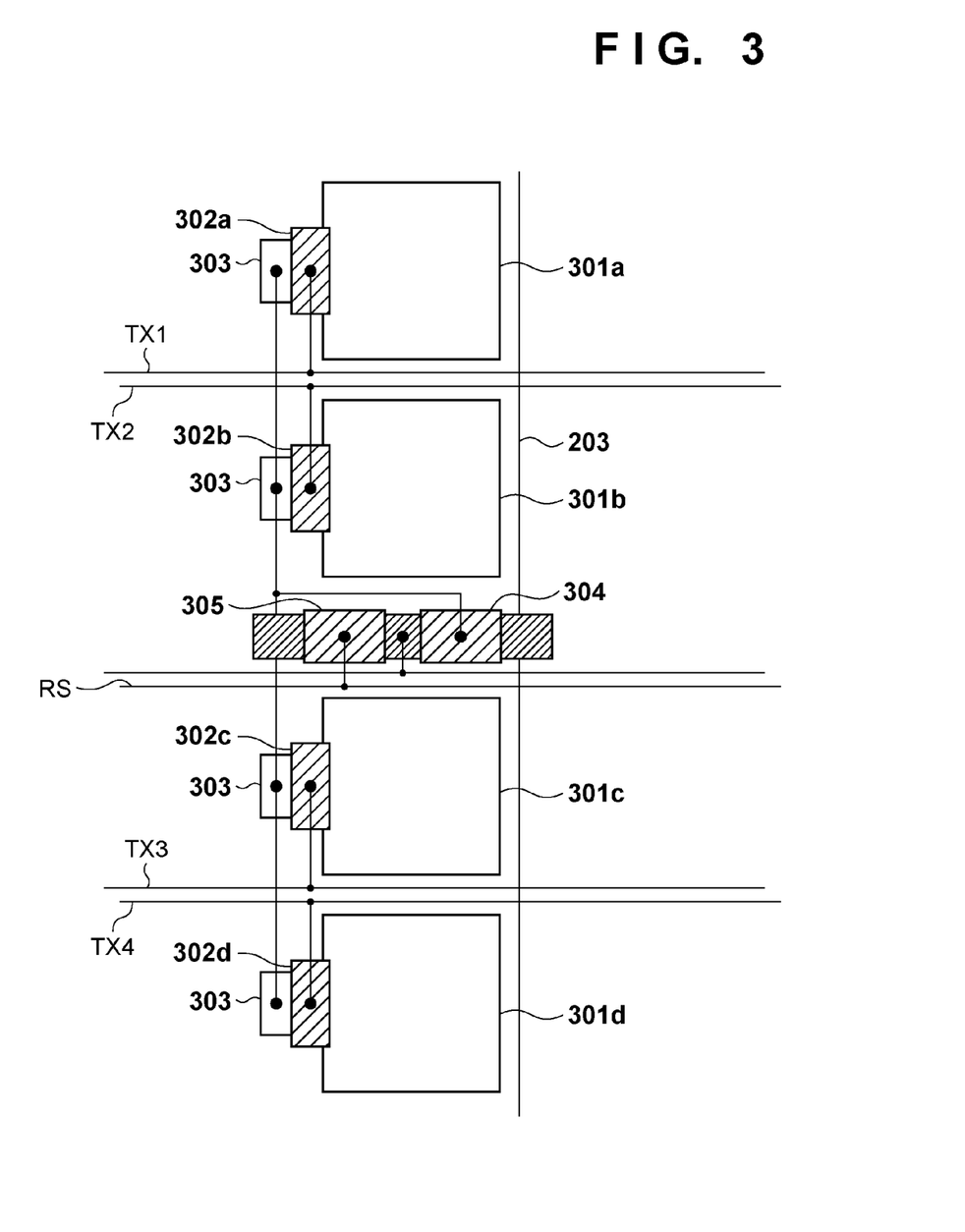
FIG. 3 is a view showing the arrangement of a pixel unit of the image sensor according to the embodiment of the present invention.

FIG. 3 is a view showing four predetermined pixels in the pixel unit 201 shown in FIG. 2. Photodiodes (to be referred to as PDs hereinafter) 301a to 301d receive light coming from the lens 101, and generate charges by a photo-electric effect. Transfer transistors (to be referred to as transfer Trs hereinafter) 302a to 302d are controlled by transfer signal lines TX1 to TX4 from the vertical scanning circuit 202, and transfer charges generated by the PDs 301a to 301d.

Floating diffusions (to be referred to as FDs hereinafter) 303 temporarily accumulate charges transferred from the PDs 301a to 301d. A source-follower amplifier (to be referred to as SF hereinafter) 304 converts charges into a voltage signal according to a charge amount accumulated on the FDs 303, and outputs it onto the vertical output lines 203. A reset transistor (reset Tr) 305 is controlled by a reset signal line RS from the vertical scanning circuit 202, and forcibly discharges charges on the PDs 301a to 301d and FDs 303.

The above description focuses attention on four predetermined pixels in the image sensor 102. The image sensor 102 of this embodiment adopts an arrangement in which pixels are two-dimensionally arranged in vertical and horizontal directions (row and column directions) to have the four pixels shown in FIG. 3 as one period (unit structure). That is, the image sensor 102 adopts a structure in which the transfer signals TX1 to TX4 and reset signal RS supplied from the vertical scanning circuit 202 are commonly supplied to pixels arranged in a single row.

Figure 4:
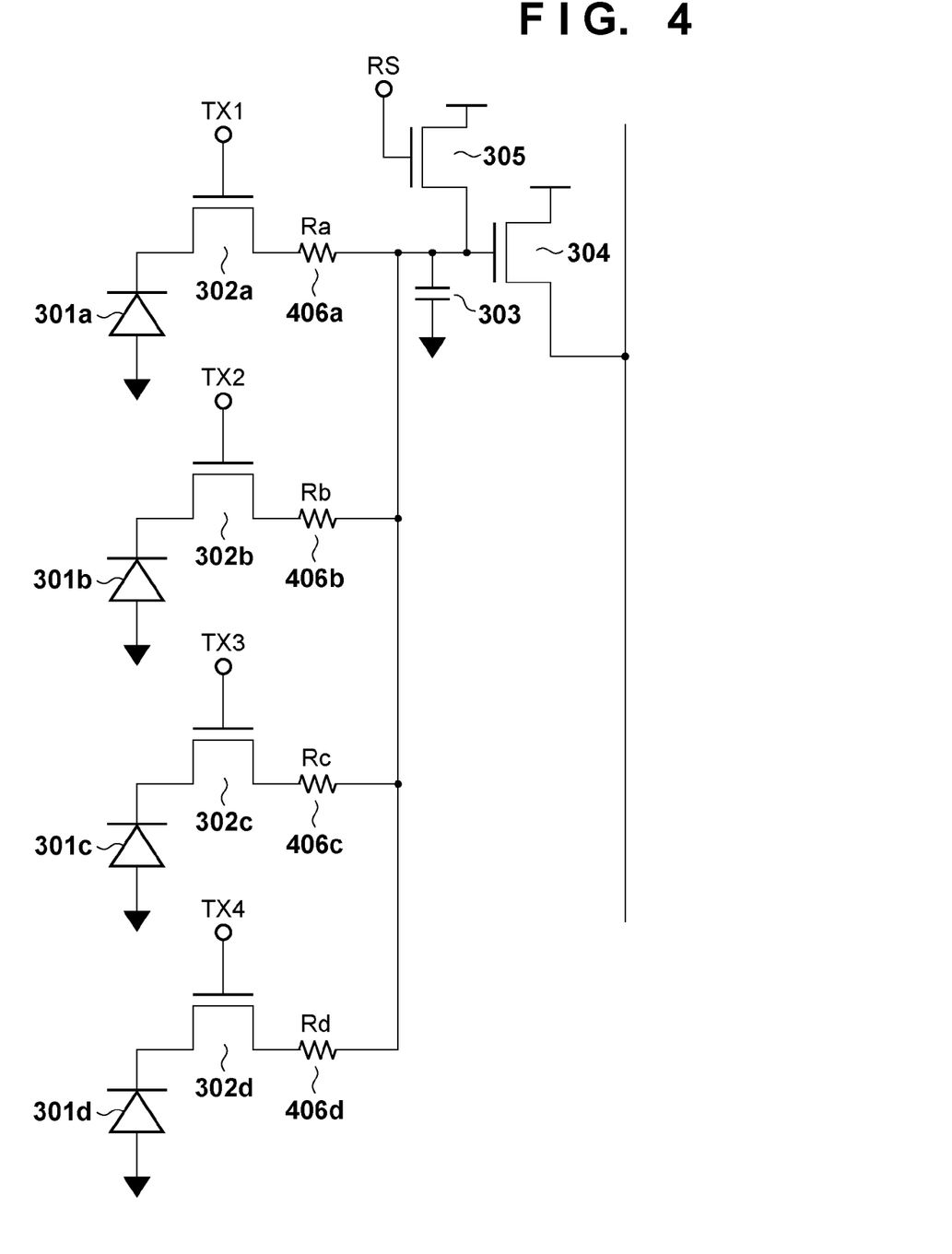
FIG. 4 is a circuit diagram showing the arrangement of a circuit of the pixel unit according to the embodiment of the present invention.

FIG. 4 is a circuit diagram around the pixel unit in the image sensor 102. As shown in FIG. 4, a circuit includes the PDs 301a to 301d, transfer Trs 302a to 302d, FD 303, SF 304, and reset Tr 305. Resistance components 406a to 406d are those of wirings which exist between the PDs 301a to 301d and SF 304, and their values are respectively represented by Ra to Rd.

The pixel unit of this embodiment adopts a structure in which the PDs 301b and 301c are arranged at positions closer to the SF 304 than the PDs 301a and 301d, as shown in FIG. 3. Since line resistances of transfer lines used to transfer charges from the PDs 301a to 301d to the SF 304 are proportional to distances, the respective wiring resistance components 406a to 406d have a relation expressed by:

$$Ra \approx Rd \geq Rb \approx Rc \quad (1)$$

Based on this relation, a difference is generated between charge transfer characteristics of the pixels having large wiring resistances like the PDs 301a and 301d and those having small wiring resistances like the PDs 301b and 301c.

Figure 5A:
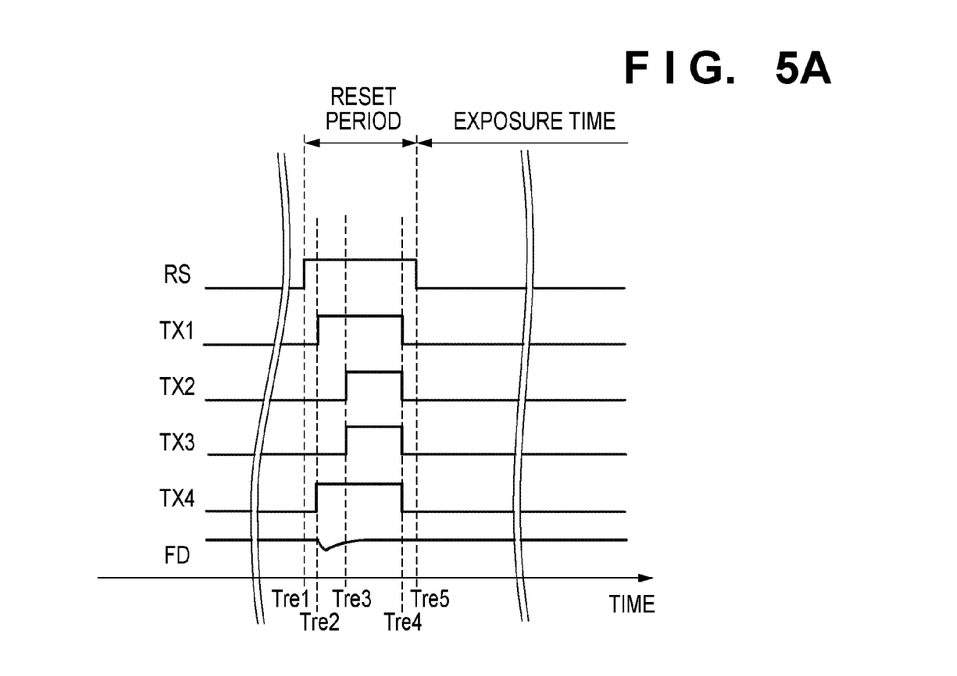
FIGS. 5A and 5B are timing charts showing a driving method of the image sensor according to the first embodiment.
Figure 5B:
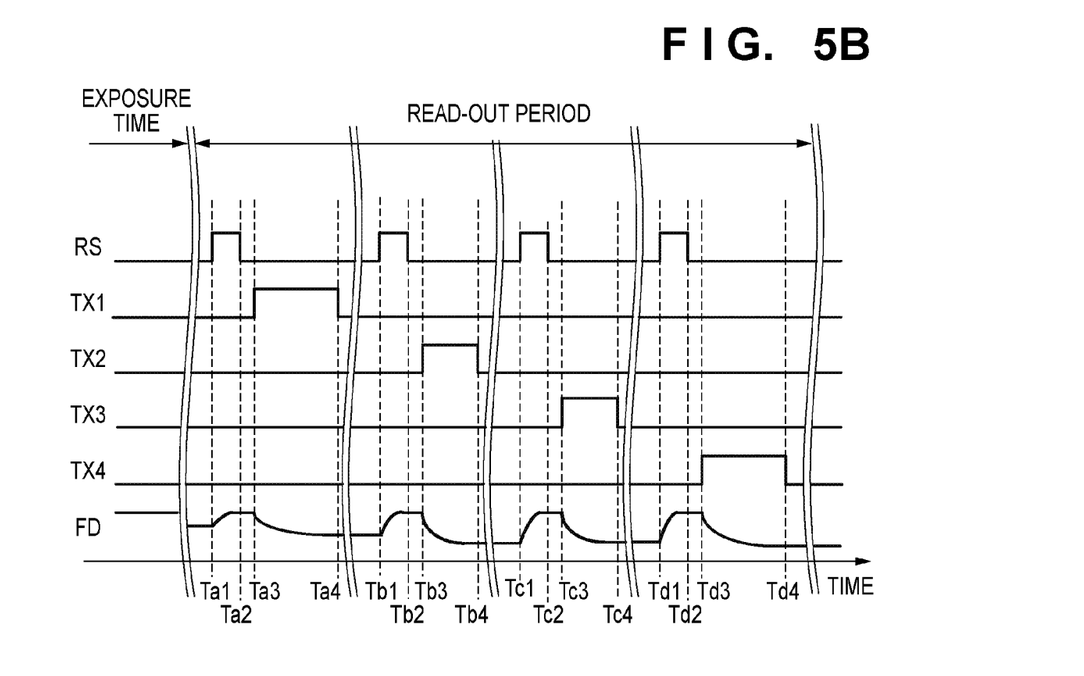

FIGS. 5A and 5B are timing charts for driving the image sensor 102 according to this embodiment. FIG. 5A shows a reset operation upon discharging charges generated on the PDs 301a to 301d. More specifically, after an image capturing operation is started in response to a signal from the operation unit 109 or the like, all reset signal lines RS go high to enable all reset Trs 305 at time Tre1.

Next, at time Tre2, the transfer signal lines TX1 and TX4 go high to enable the transfer Trs 302a and 302d, thus starting charge transfer from the PDs 301a and 301d. At time Tre3, the transfer signal lines TX2 and TX3 go high to enable the transfer Trs 302b and 302c, thus starting charge transfer from the PDs 301b and 301c.

At time Tre4, the transfer signal lines TX1 to TX4 of all rows go low to disable the transfer Trs 302a to 302d of all the rows. Then, transfer of charges generated on the PDs 301a to 301d of all the rows is complete, and resetting of all the PDs 301a to 301d is complete. From this time, an exposure operation is started.

FIG. 5A exemplifies a global reset operation for resetting all the PDs at the same time. Alternatively, even in a rolling reset operation for sequentially resetting the PDs row by row, the same effects can be obtained by executing the operation of this embodiment.

FIG. 5B shows a read-out operation upon reading out charges generated on the PDs 301 within a predetermined time period as a video signal. More specifically, an exposure operation for the predetermined time period is executed after the reset operation shown in FIG. 5A, and light condensed on the image sensor 102 is intercepted using the shutter included in the lens 101. After that, the read-out operation is sequentially executed row by row.

At time Ta1, the reset signal line RS goes high to start discharging of an unnecessary charge accumulated on the FD 303. Next, at time Ta2, the reset signal line RS goes low, and the electric potential of the FD 303 is reset to a predetermined level. At time Ta1, the transfer signal line TX1 goes high, thus starting charge transfer from the PD 301a. At time Ta4, the transfer signal line TX1 goes low, and the electric potential of the FD 303 reaches a constant value.

This electric potential level of the FD 303 is converted into a voltage signal by the SF 304, and is read out onto the vertical output line 203, thus extracting a charge amount generated on the PD 301a for the predetermined time period as a video signal. The aforementioned operation is similarly performed for the PDs 301b to 301d, thus obtaining an image for one frame.

As a characteristic feature of the driving method of the image sensor 102 according to this embodiment, in both the reset operation and read-out operation, the ON time of the transfer Trs 302a and 302d is set to be longer than that of the transfer Trs 302b and 302c. The reason for this will be described below with reference to FIG. 6.

Figure 6:
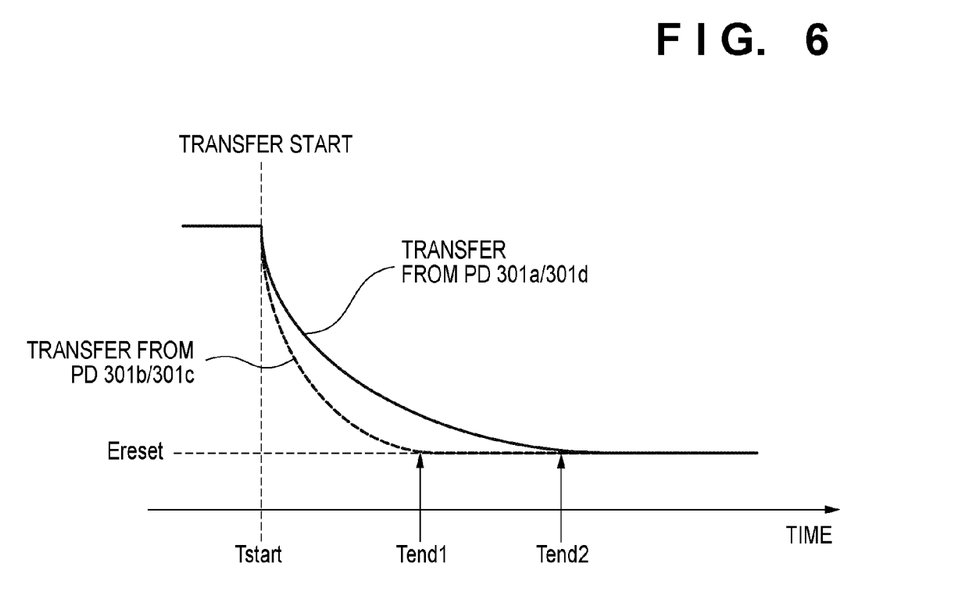
FIG. 6 is a graph showing effects of the first embodiment.

FIG. 6 is a graph showing a temporal change in FD electric potential upon transferring a charge from the PD. After charge transfer from the PD is started at time Tstart, the electric potential of the FD transiently changes to an ordinary reset level Ereset. However, as given by inequality (1), the wiring resistances from the PDs 301a and 301d to the FD are higher than those of the PDs 301b and 301c. For this reason, letting Tend1 be a time required to transfer charges from the PDs 301b and 301c, a time required to transfer charges from the PDs 301a and 301d is Tend2 longer than Tend1. That is, in order to accurately transfer charges from the PDs 301a and 301d, the transfer Tr 302 has to be enabled during a period longer than that for the PDs 301b and 301c.

In this manner, even when transient responses (transfer efficiencies) generated due to differences of the resistance components 407a to 407d of the respective wirings, as given by inequality (1), have a speed difference, charges can be accurately transferred by changing an ON period of the transfer Tr.

In this embodiment, since the ON period of the transfer Tr is prolonged as needed, it can be prevented from being unnecessarily prolonged. Adverse effects such as a continuous shot speed drop due to an excessively long ON period of the transfer Tr and an image quality drop due to the influence of charges different from an image signal can be suppressed.

Note that this embodiment has given the example while focusing on a difference between wiring resistances generated upon sharing the FD by the four PDs. However, by executing the operation of this embodiment for transfer characteristic variations caused by capacitance components, inductance components, offset components of dark currents or the like, characteristic variation components of the transfer Tr 302, variation components of electric potentials of the PDs and FD, and the like other than the resistance components, the same effects can be obtained.

This embodiment has exemplified the case in which the FD is shared by the four PDs. By executing the operation of this embodiment upon sharing the FD by two or more PDs, the same effects can be obtained. This embodiment has exemplified the case in which the ON period of the transfer Tr is changed in both the reset operation and read-out operation. However, change amounts in both the operations may be different, or this embodiment may be carried out in one of these operations.

Second Embodiment

The first embodiment has explained the method of controlling the ON period of the transfer Tr according to the resistance components between the PDs and FD in the image sensor in which the FD is shared by the plurality of PDs, thereby eliminating the influence caused by a layout. However, a period in which charges of the PDs can be accurately transferred often depends not only on the layout but also on exposure conditions such as light amounts applied to the PDs.

Figure 7:
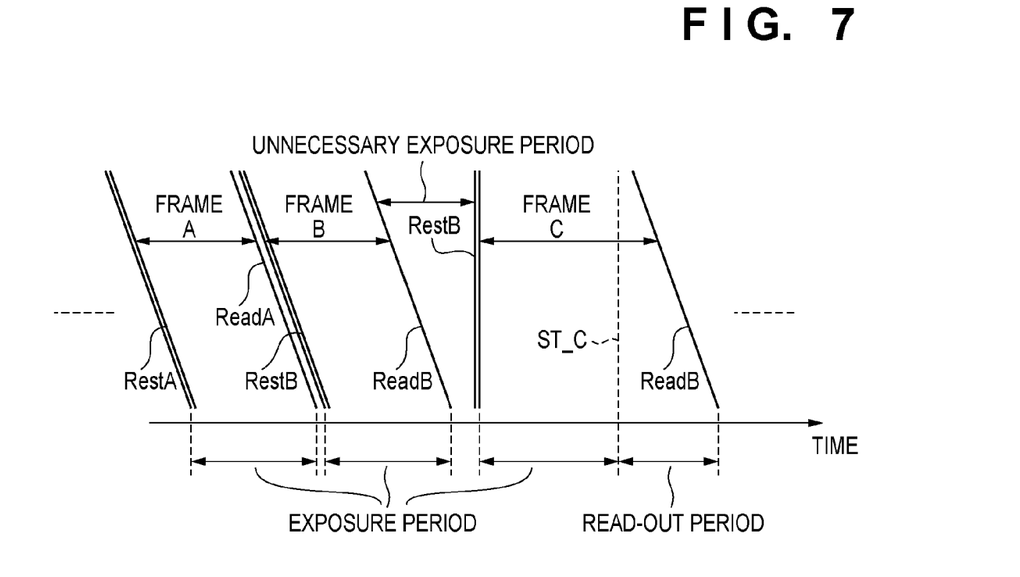
FIG. 7 is a timing chart showing the operation of an image sensor according to the second embodiment.

FIG. 7 shows a sequence for switching operations from a rolling shutter operation to a global shutter operation at the time of image acquisition according to this embodiment.

In frames A and B, the rolling shutter operation is executed to continuously fetch images. Then, in frame C, the shutter operation is switched, and the global shutter operation is executed. In frame C in which the global shutter operation is executed, all rows are reset at the same time. Then, after an elapse of a predetermined exposure time, light condensed on the image sensor 102 is intercepted using the shutter included in the lens 101. During the light-intercepted period, image signals are sequentially read out from respective rows.

In this case, an unnecessary exposure period exists between frames B and C. Since the PDs 301 receive light via the lens 101 even during this period, unnecessary charges which are not read out as image signals are generated. Normally, the unnecessary charges generated on the PDs 301 during this period are discharged in the global shutter operation of frame C. However, depending on light amounts condensed on the image sensor 102 during the unnecessary exposure period, unnecessary charges cannot often be fully discharged.

Figure 8A:
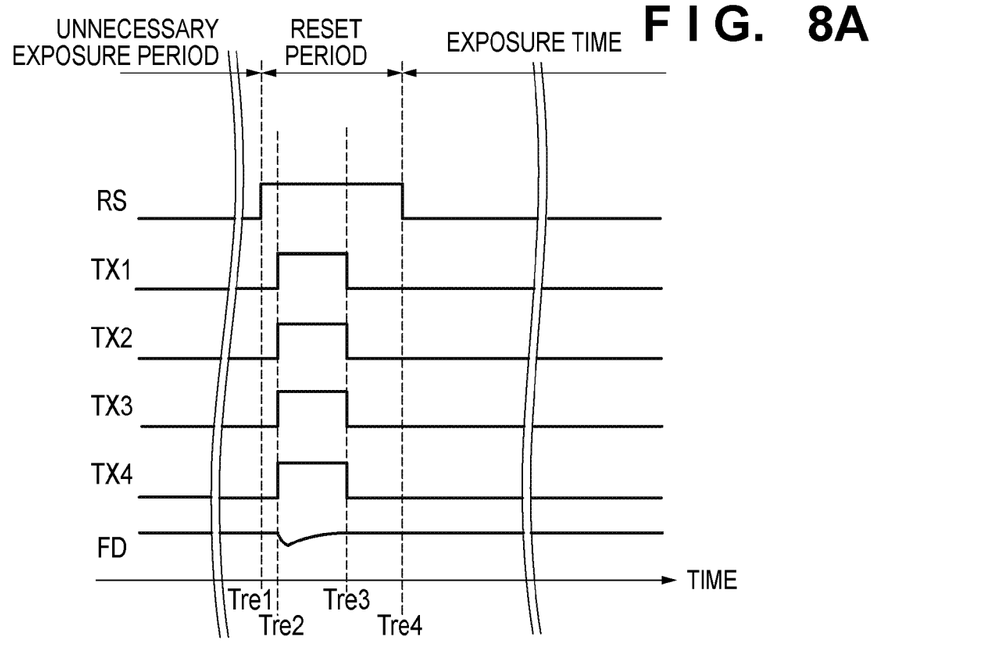
FIGS. 8A and 8B are timing charts showing a driving method of the image sensor according to the second embodiment.
Figure 8B:
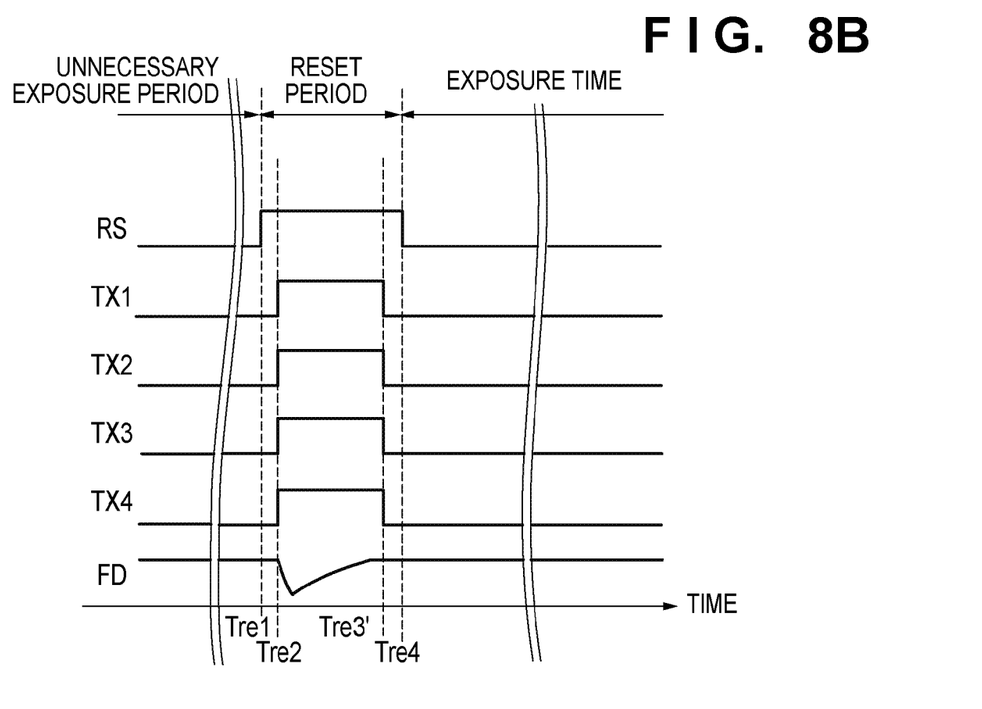

FIGS. 8A and 8B are timing charts of the normal global reset operation in the predetermined four pixels according to this embodiment. The circuit diagram around the pixel unit is the same as that of the first embodiment.

More specifically, after an elapse of the unnecessary exposure period shown in FIG. 7, the reset signal lines RS of all the rows go high to enable the reset Trs 305 of all the rows at time Tre1. Next, at time Tre2, the transfer signal lines TX1 to TX4 go high to enable the transfer Trs 302a to 302d. Then, charge transfer from the PDs 301 is started.

Next, at time Tre3, the transfer signal lines TX1 to TX4 of all the rows go low to disable the transfer Trs 302a to 302d of all the rows. At time Tre4, the reset signal lines RS go low to complete transfer of charges generated on the PDs 301a to 301d of all the rows and to complete resetting of all the PDs 301a to 301d. From this time, a predetermined exposure operation is started.

FIG. 8B shows a case in which charges of a predetermined amount or more are generated on the PDs 301a to 301d during the unnecessary exposure period. More specifically, after the reset operation shown in FIG. 8A, the transfer signal lines TX1 to TX4 go low at time Tre3'. In this case, with reference to Tre1, Tre3 and Tre3' have a relation expressed by:

$$Tre3' \geq Tre3 \tag{2}$$

That is, as the driving method of the transfer Trs 302a to 302d in this embodiment, an ON time of the transfer Trs 302a to 302d is changed according to a charge amount generated during the unnecessary exposure period. The reason for this will be described below with reference to FIG. 9.

Figure 9:
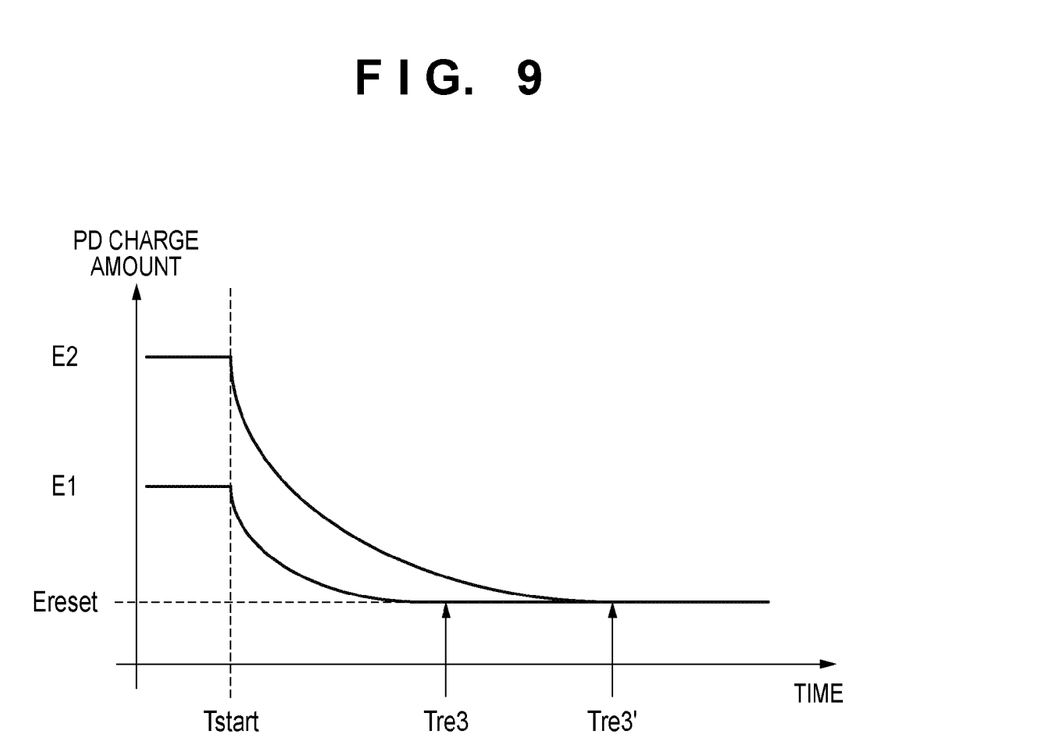
FIG. 9 is a graph showing effects of the second embodiment.

FIG. 9 shows a temporal change in FD electric potential upon transferring charges from the PD.

After charge transfer from the PD is started at time Tstart, the FD electric potential changes transiently. For this reason, a time in which the electric potential changes to an ordinary reset level Ereset depends on a charge amount generated on the PD. Charges generated during the unnecessary exposure period in the normal rolling shutter operation are suppressed to the ordinary reset level Ereset between Tstart and Tre3. However, when the unnecessary exposure period is long, the electric potential cannot often be changed to the ordinary reset level Ereset during the period until Tre3. In this case, the reset time is prolonged to change the ON time of the transfer Trs 302a to 302d to Tre3'. In this case, the respective transfer Trs 302a to 302d which share the FD 303 have a common ON time. However, ON times of respective rows may be independently set according to the transfer characteristics from the PDs 301a to 301d.

As described above, as shown in FIG. 9, even when a charge amount generated during the unnecessary exposure period has a difference, charges can be accurately transferred by changing the ON period of the transfer Tr. Also, according to this embodiment, since the ON period of the transfer Tr is prolonged as needed, it can be prevented from being unnecessarily prolonged. Adverse effects such as a continuous shot speed drop due to an excessively long ON period of the transfer Tr and an image quality drop due to the influence of charges different from an image signal can be suppressed.

This embodiment has given the example focusing attention on the operation for switching from the rolling reset operation to the global reset operation. However, when charges of a predetermined amount or more are generated in the reset operation, and the transfer characteristics of the respective PDs have a difference, the same effects can be obtained by executing the operation of this embodiment.

Note that in this embodiment, the ON period of the transfer Tr is changed according to a charge amount generated during the predetermined period. Alternatively, the ON period may be changed according to image capturing conditions such as a shutter speed, gain amount, aperture value, object luminance, and the like. This embodiment focuses attention on the reset operation. However, this embodiment also includes a case in which the ON period of the transfer Tr during the read-out operation is changed according to a charge amount generated during an exposure period.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-186360, filed Aug. 29, 2011, which is hereby incorporated by reference herein in its entirety.

What is claimed is:

1. An image capturing apparatus comprising:
an image sensor which includes a plurality of pixel groups, each pixel group including a plurality of pixel units and a floating diffusion unit which temporarily accumulates charges from the plurality of pixels, each pixel unit including a photo-electric conversion unit which converts light into charges and a transfer transistor which transfers the charges from the photo-electric conversion unit to the floating diffusion unit of the corresponding pixel group, and a timing signal generator which generates timing signals and outputs the generated timing signals to said image sensor,
wherein at least two of the transfer transistors of a predetermined pixel group are turned on for different periods by the timing signals based on transfer efficiencies of the at least two transfer transistors.

2. The image capturing apparatus according to claim 1, wherein each of the pixel groups further includes a source-follower amplifier.

3. The image capturing apparatus according to claim 2, wherein the plurality of pixel groups are divided into a plurality of groups, and the periods during which each of the transfer transistors is turned on is controlled for each divided group.

4. The image capturing apparatus according to claim 2, wherein controlling of the periods during which each of the transfer transistors are turned on is repeated by setting a number of the photo-electric conversion units connected to one of the floating diffusion units as one cycle.

5. The image capturing apparatus according to claim 1, wherein the plurality of pixel groups are two-dimensionally arranged in a row direction and a column direction, and periods during which each of the transfer transistors are turned on are controlled for each row.

6. The image capturing apparatus according to claim 1, wherein the transfer efficiencies of the respective transfer transistors are determined by at least one of distances between the photo-electric conversion units and the floating diffusion units, wiring resistances, capacitance components, inductor components, offset components caused by dark currents, characteristics of the transfer transistors, and an electric potential of a pixel unit.

7. A control method of an image sensor which includes a plurality of pixel groups, each pixel group including a plurality of pixel units and a floating diffusion unit which temporarily accumulates charges from the plurality of pixels, each pixel unit including a photo-electric conversion unit which converts light into charges and a transfer transistor which transfers the charges from the photoelectric conversion unit to the floating diffusion unit of a pixel group, said control method comprising:
a control step of controlling at least two of the transfer transistors of a predetermined pixel group to turn on for different periods by timing signals based on transfer efficiencies of the at least two transfer transistors.

8. The control method according to claim 7, wherein each of the pixel groups further includes a source-follower amplifier.

9. The control method according to claim 8, wherein the plurality of pixel groups are divided into a plurality of groups, and in the control step, the periods during which each of the transfer transistors are turned on is controlled for each divided group.

10. The control method according to claim 8, wherein in the control step, controlling of the periods during which each of the transfer transistors are turned on is repeated by setting a number of the photo-electric conversion units connected to one of the floating diffusion units as one cycle.

11. The control method according to claim 7, wherein the plurality of pixel groups are two-dimensionally arranged in a row direction and a column direction, and in the control step, the periods during which each of the transfer transistors are turned on is controlled for each row.

12. The control method according to claim 7, wherein the transfer efficiencies of the respective transfer transistors are determined by at least one of distances between the photoelectric conversion units and the floating diffusion units, wiring resistances, capacitance components, inductor components, offset components caused by dark currents, characteristics of the transfer transistors, and an electric potential of a pixel unit.

* * * * *